United States Patent
Matsumoto et al.

(10) Patent No.: US 7,962,297 B2
(45) Date of Patent: Jun. 14, 2011

(54) FAILURE DETERMINATION DEVICE FOR CELL VOLTAGE MONITOR

(75) Inventors: Yuji Matsumoto, Saitama (JP); Kenichiro Ueda, Saitama (JP); Junji Uehara, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 267 days.

(21) Appl. No.: 12/038,263

(22) Filed: Feb. 27, 2008

(65) Prior Publication Data
US 2008/0208490 A1 Aug. 28, 2008

(30) Foreign Application Priority Data

Feb. 28, 2007 (JP) ................. 2007-048798

(51) Int. Cl.
*G01R 31/00* (2006.01)
(52) U.S. Cl. .............. 702/58; 702/63; 702/79; 702/185; 702/189
(58) Field of Classification Search .......... 702/58, 702/63, 79, 185, 189; 324/430, 431; 320/101, 320/134, 136, 137; 307/48, 54
See application file for complete search history.

(56) References Cited

U.S. PATENT DOCUMENTS

| | | | | |
|---|---|---|---|---|
| 5,250,904 A | * | 10/1993 | Salander et al. | 324/430 |
| 6,532,425 B1 | * | 3/2003 | Boost et al. | 702/63 |
| 6,724,194 B1 | * | 4/2004 | Barton | 324/432 |
| 6,893,756 B2 | * | 5/2005 | Clingerman et al. | 429/22 |
| 7,211,343 B2 | * | 5/2007 | Georgii | 429/13 |

FOREIGN PATENT DOCUMENTS

| | | |
|---|---|---|
| JP | 2004-178899 | 6/2004 |
| JP | 2006-153744 | 6/2006 |
| JP | 2006-153780 | 6/2006 |

OTHER PUBLICATIONS

Ramschak et al., 'Detection of fuel cell critical status by stack voltage analysis' 2006, Science Direct Publication, pp. 837-840.*

* cited by examiner

*Primary Examiner* — Mohamed Charioui
*Assistant Examiner* — Elias Desta
(74) *Attorney, Agent, or Firm* — Nelson Mullins Riley & Scarborough LLP; Anthony A. Laurentano

(57) ABSTRACT

A failure determination device for a cell voltage monitor is provided. The cell voltage monitor detects cell voltages of a plurality of single cells. The failure determination device includes a minimum value determination unit for determining whether or not a present cell voltage which the cell voltage monitor detects is equal to or lower than a minimum detectable cell voltage, and a failure determination unit for determining that the cell voltage monitor has a failure. A failure is detected when the present cell voltage is equal to or lower than the minimum value cell voltage, and a cell voltage detected by the cell voltage monitor in the past and stored in the memory is greater than a determination cell voltage.

20 Claims, 6 Drawing Sheets

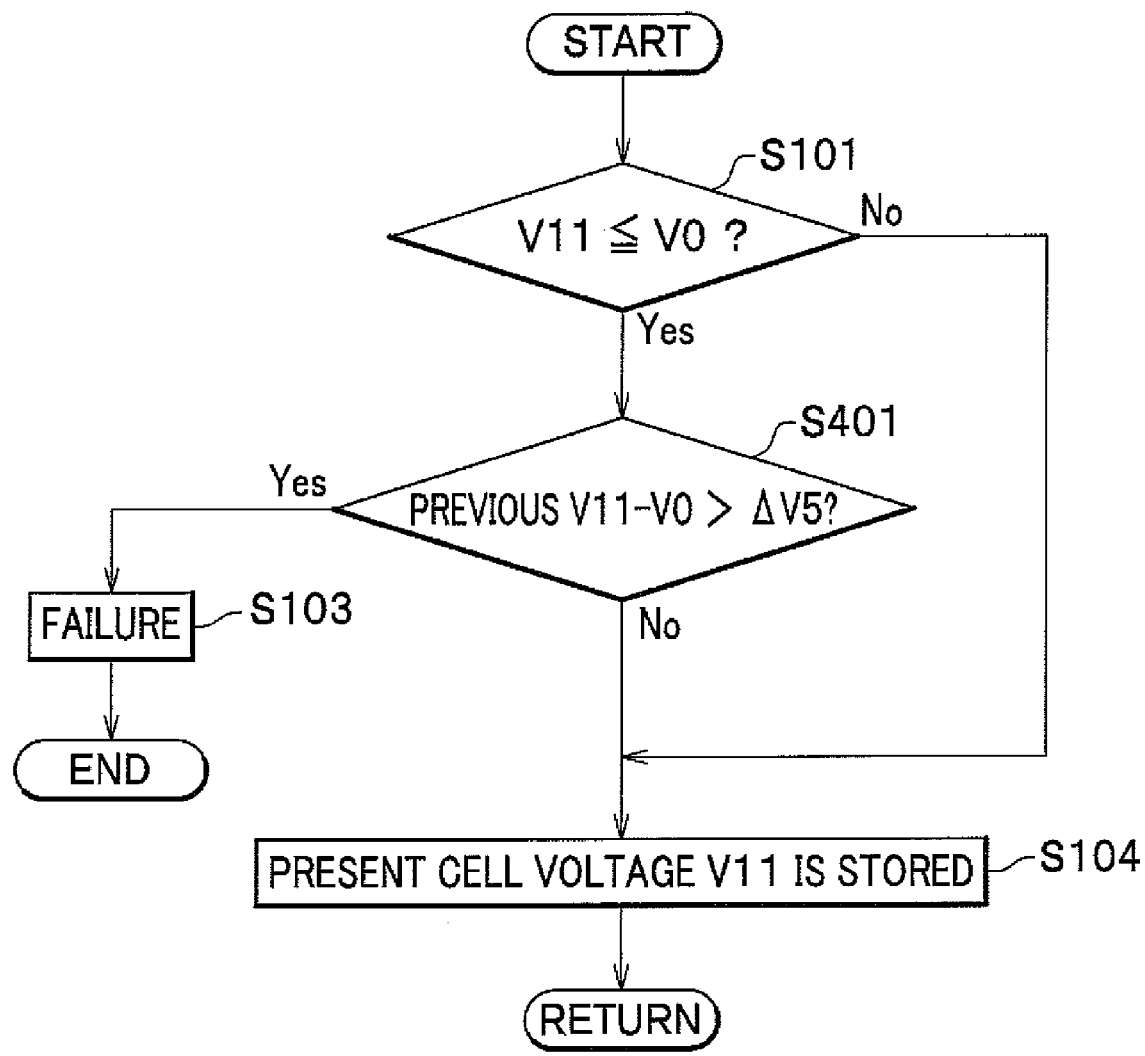

FAILURE DETERMINATION DEVICE FOR CELL VOLTAGE MONITOR

CROSS-REFERENCE TO RELATED APPLICATION(S)

This application claims the foreign priority benefit under Title 35, United States Code, §119 (a)-(d), of Japanese Patent Application No. 2007-048798, field on Feb. 28, 2007 in the Japan Patent Office, the disclosure of which is herein incorporated by reference in its entirety.

BACKGROUND OF THE INVENTION

1. Field of the Invention

The present invention relates to a failure determination device for a cell voltage monitor which detects voltages of a plurality of single cells connected in series.

2. Description of the Related Art

In recent years, a fuel cell including a polymer electrolyte fuel cell (PEFC) has been developed in earnest. The polymer electrolyte fuel cell is provided with an anode and a cathode. The anode is provided with hydrogen (fuel cell gas) and the cathode is supplied with oxygen (oxidant gas) to cause an electrochemical reaction to generate electricity. Because each fuel cell has a low output, and the fuel cell includes a plurality of single cells, a fuel cell stack to form the plurality of single cells connected in series and stacked has widely been used.

However, a generation of an electricity by the single cell cannot be measured from an output current or an output voltage of the fuel cell stack. Accordingly, a cell voltage monitor which detects a voltage of a single cell (cell voltage) is connected with each single cell, thereby the generation of an electricity by the single cell is measured (refer to JP-2004178899). When a cell voltage steps down and the generation of an electricity by the single cell is decreased, the generation of an electricity by each single cell is restored by airing in order to remove excessive water attached on the surface of a membrane electrode assembly (MEA).

The cell voltage monitor has a minimum value of a cell voltage (minimum value cell voltage) in a detectable range depending on a voltage detection circuit. A failure determination device for the cell voltage monitor determines that the cell voltage monitor has a failure when a detected cell voltage is equal to the minimum value cell voltage.

Therefore, the cell voltage monitor cannot determine whether or not the minimum value cell voltage is brought by a failure. A detected cell voltage is equal to or lower than the minimum value cell voltage when a part of the cell voltage monitor has a failure (for example, due to disconnection of a wiring harness). In addition, a cell voltage of a single cell (fuel cell stack) also becomes equal to or lower than the minimum value cell voltage when a demand for generating electricity is reduced. In the end, the failure determination device for the cell voltage monitor determines that the cell voltage monitor without a failure is damaged when the minimum value cell voltage is detected in the process of a normal voltage drop due to a low demand of generating electricity.

BRIEF SUMMARY OF THE INVENTION

An object of the present invention is to provide a failure determination device for a cell voltage monitor which properly determines whether a cell voltage monitor has a failure or not. Consequently, the failure determination device for a cell voltage monitor can be cost-effective and light.

Preferably, the present invention is to provide a failure determination device for a cell voltage monitor which detects cell voltages of a plurality of single cells connected in series at a predetermined timing (interval), the failure determination device for a cell voltage monitor comprises: a memory for storing a cell voltage which the cell voltage monitor detects; a minimum value determination unit for determining whether or not a present cell voltage detected by the cell voltage monitor at the present time is equal to or lower than a minimum value cell voltage which is in a detectable range of the cell voltage monitor; and a failure determination unit for determining that the cell voltage monitor has a failure when the minimum value determination unit determines that the present cell voltage is equal to or lower than the minimum value cell voltage, and a cell voltage detected by the cell voltage monitor in the past and stored in the memory is higher than a determination cell voltage.

The determination cell voltage is set on the basis of a timing (interval) at which the cell voltage monitor detects a cell voltage, and on the basis of a decreasing ratio of the cell voltage in the process of a normal voltage drop.

In other words, a determination cell voltage is set as a cell voltage which is equal to a cell voltage detected at a previous time when a previous detected cell voltage is applied for determination as a cell voltage stored in the memory, and a minimum value cell voltage is detected at the present time in the process of a normal voltage drop.

According to the failure determination device for a cell voltage monitor, a memory stores a cell voltage which the cell voltage monitor detects at a predetermined timing (interval). The failure determination unit determines that the cell voltage monitor has a failure when the minimum value determination unit determines that the present cell voltage detected by the cell voltage monitor is equal to or lower than the minimum value cell voltage, and a past cell voltage detected by the cell voltage monitor in the past and stored in the memory is higher than a determination cell voltage.

In other word, the failure determination device for a cell voltage monitor can determine that the cell voltage monitor has a failure when the past cell voltage is higher than the determination cell voltage. This is because the cell voltage drops with larger potential difference than that expected in a normal voltage drop by the time the present cell voltage is detected.

The failure determination device for a cell voltage monitor includes a memory, a minimum value determination unit, and a failure determination unit, each of these has a CPU, ROM and RAM and runs on an operation program. Since there is no need to add special parts for determining a failure, the cell voltage monitor can be made with reduced costs and handled easier without being bulky. Therefore, the failure determination device for a cell voltage monitor can easily be installed in a fuel cell vehicle as described later in an embodiment.

In addition, preferably, the failure determination device for a cell voltage monitor comprises a determination cell voltage setting unit which sets the determination cell voltage on the basis of a total output or a temperature of the plurality of single cells as a whole (fuel cell stack described later in an embodiment).

In view of the above, the failure determination device for a cell voltage monitor can determine whether or not the cell voltage monitor has a failure.

Preferably, the present invention provides a failure determination device for a cell voltage monitor which detects cell voltages of plurality of single cells connected in series at a predetermined timing (interval), the device comprises: a memory for storing a cell voltage which the cell voltage monitor detects; a minimum value determination unit for determining whether or not the present cell voltage detected by the cell voltage monitor at the present time is equal to or lower than the minimum value cell voltage which is in a detectable range of the cell voltage monitor; and a failure determination unit for determining that the cell voltage monitor has a failure when the minimum value determination unit determines that the present cell voltage is equal to or lower than the minimum value cell voltage, and a potential difference between a cell voltage, which has been detected by the cell voltage monitor in the past and stored in the memory, and the minimum value cell voltage is higher than a determination cell potential difference.

The determination cell potential difference is set on the basis of a timing (interval) at which the cell voltage monitor detects a cell voltage and a decreasing ratio of a cell voltage in the process of a normal voltage drop.

In other words, the determination cell potential difference is set as a potential difference between the minimum value cell voltage and the cell voltage which has been detected at the previous time when a previous detected cell voltage is applied for determination as a cell voltage stored in the memory, and a minimum value cell voltage is detected at the present time in the process of normal voltage drop.

According to the failure determination device for a cell voltage monitor, the cell voltage monitor stores a cell voltage at a predetermined timing (interval). The failure determination unit properly determines that the cell voltage monitor has a failure when the minimum value determination unit determines that the present cell voltage detected by the cell voltage monitor is equal to or lower than the minimum value cell voltage, and a potential difference between the minimum value cell voltage and a past cell voltage detected by the cell voltage monitor in the past and stored in the memory is higher than a determination cell voltage.

In other words, the failure determination device for a cell voltage monitor determines that the cell voltage monitor has a failure when a potential difference between the past cell voltage and the minimum value cell voltage is higher than the determination cell voltage. This is because a cell voltage drops with larger potential difference than that expected in a normal voltage drop by the time the present cell voltage is detected.

The failure determination device for a cell voltage monitor includes a memory, a minimum value determination unit and a failure determination unit, each of these has a CPU, ROM and RAM and runs on an operation program. Therefore, the failure determination device can be made with reduced costs and handled easier without being bulky.

In addition, preferably, the failure determination device for a cell voltage monitor comprises a determination cell potential difference setting unit which sets the determination cell potential difference on the basis of a total output or a temperature of the plurality of single cells as a whole (fuel cell stack described later in an embodiment).

In view of the above, the failure determination device for a cell voltage monitor can determine whether or not the cell voltage monitor has a failure.

Further, preferably, the failure determination unit determines a failure on the basis of a cell voltage detected in the past just before the failure determination and stored in the memory.

The failure determination device determines whether or not the cell voltage monitor has a failure on the basis of a determination cell voltage and a cell voltage just before the failure determination, or on the basis of a determination cell potential difference and a potential difference lied between a minimum value cell voltage and a cell voltage just before the failure determination.

From the time a cell voltage just before the failure determination is detected until the present cell voltage is detected, the failure determination device for a cell voltage monitor can determine whether or not a cell voltage of a single cell drops in the process of a normal voltage drop and can also determine whether or not the cell voltage suddenly drops due to a failure of the cell voltage monitor (for example, due to disconnection of a wiring harness). In other words, the failure determination device for a cell voltage monitor can determine that the cell voltage monitor has a failure when a cell voltage detected just before the failure determination is higher than a determination cell voltage, or when a potential difference between a minimum value cell voltage and a cell voltage detected just before the failure determination is higher than a determination cell potential difference.

Further, preferably, the failure determination device for a cell voltage monitor comprises the failure determination unit, the failure determination unit does not determine whether or not the cell voltage monitor has a failure when a cell voltage, on which the determination for a failure is based, is unstable. Consequently, an error of determination can be prevented in advance.

For example, the cell voltage just before the failure determination is unstable when an amplitude of a cell voltage detected at a predetermined timing (interval) is greater than a predetermined amplitude at a designated time. In this case, the designated time and the predetermined amplitude are set in accordance with specifications of a single cell, a test in advance and the like.

An object of the present invention is to provide a failure determination device for a cell voltage monitor which properly determines whether or not the cell voltage monitor has a failure, while taking cost-effectiveness and weight reduction into account.

BRIEF DESCRIPTION OF THE DRAWINGS

FIG. 8 is a flowchart showing an operation of the fuel cell system of a fourth embodiment.

DETAILED DESCRIPTION OF PREFERRED EMBODIMENTS

Hereinafter, a first embodiment of the present invention will be described with reference to FIG. 1 to FIG. 3.
[Fuel Cell System Configuration]

Figure 1:
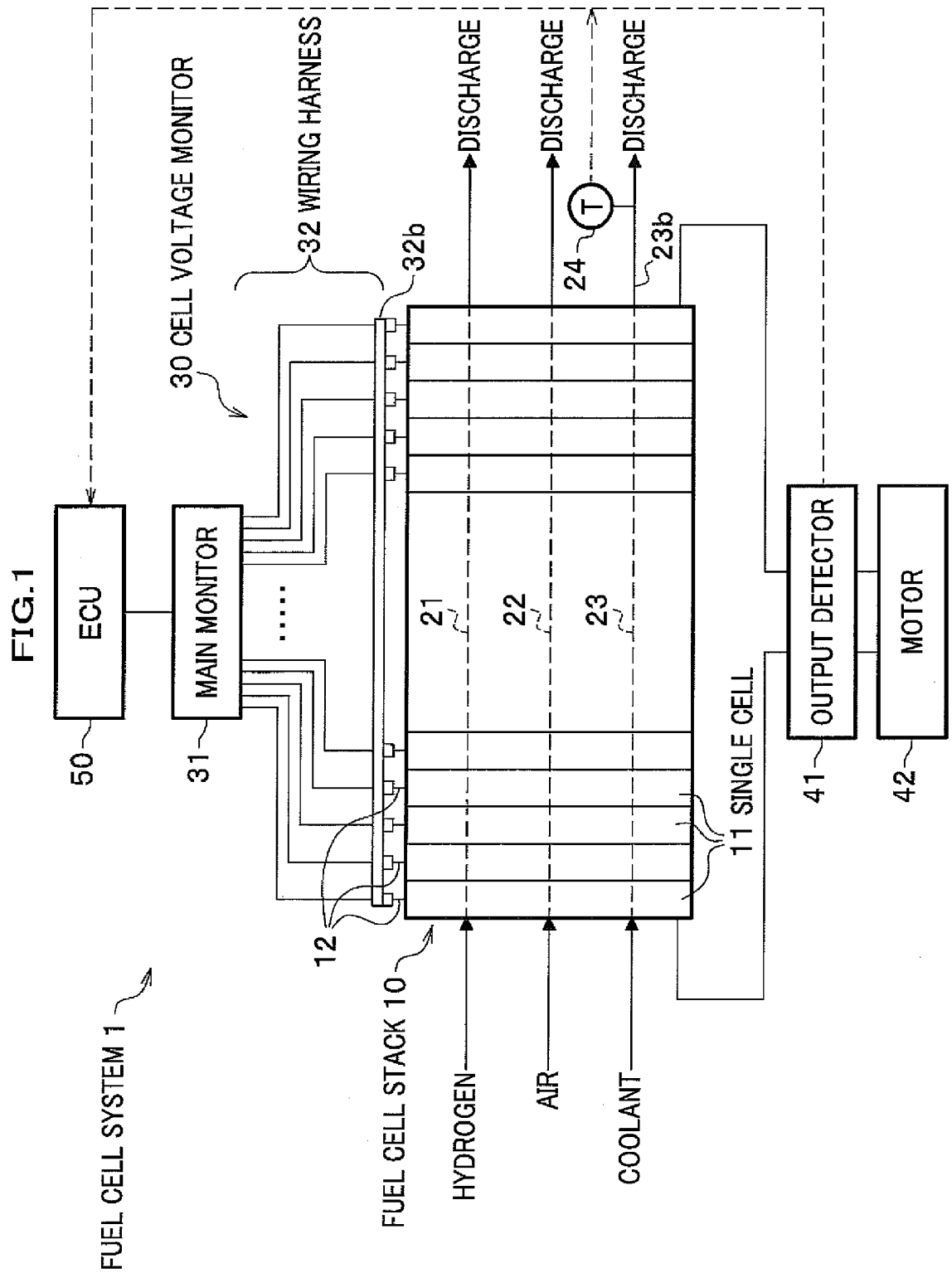
FIG. 1 is a block diagram of a fuel cell system of a first embodiment.

A fuel cell system 1 of the first embodiment shown in FIG. 1 is installed in a fuel cell vehicle (movable body) (not shown). The fuel cell system mainly includes a fuel cell stack 10, a cell voltage monitor 30 which detects voltages (hereinafter referred as a cell voltage) of single cells 11 forming the fuel cell stack 10, an output detector 41, and an electronic control unit (ECU) which electronically controls and has a failure determination device for a cell voltage monitor built-in.

[Fuel Cell Stack]

The fuel cell stack 10 includes a fuel cell wherein a plurality of polymer electrolyte single cells 11 connected in series are piled on one after another (for example, 200 to 400 units of the single cell). The single cell 11 mainly includes a membrane electrode assembly (MEA) and two units of separators between which the MEA is sandwiched. The MEA includes a solid polymer electrolyte membrane made of a polymer ion exchange membrane, and an anode and a cathode between which the solid polymer electrolyte membrane is sandwiched.

Each separator has channels which allow hydrogen and air to flow therethrough over the whole surface of each MEA, and a through-hole which takes hydrogen and air into all the single cells. These channels function as an anode flow path 21 (fuel cell flow path, reactant gas) and a cathode flow path 22 (oxidant gas flow path, reactant gas flow path).

Hydrogen (fuel gas, reactant gas) is supplied to an anode of each single cell 11 via the anode flow path 21 from a hydrogen supply unit such as a hydrogen tank (not shown). Simultaneously, air (oxidant gas, reactant gas) including oxygen is supplied to a cathode of each single cell 11 via the cathode flow path 22 from an air supply unit such as a compressor (not shown). Subsequently, an electrochemical reaction (electrode reaction) is generated by a catalyst (platinum or the like) which the anode and cathode contain. A cell voltage V11 is generated in each single cell 11. The fuel cell stack 10 as a whole generates a stack voltage (open circuit voltage (OCV)) which is a total of all the cell voltages V11. When the OCV is generated, an output of fuel cell stack 10 is controlled by an output control unit (not shown). The fuel cell stack 10 supplies a current, and the fuel cell stack 10 (single cells 11) generates electricity.

Each single cell has a terminal 12 connected with the cell voltage monitor 30.

Further, each separator has a channel and a through-hole wherein a coolant flows in order to cool the single cells 11, which prevents the fuel cell stack from overheating. The channel and the through-hole function as a coolant flow path 23. A coolant through the coolant flow path 23 flows through a pipe 23b which has a temperature sensor 24. The temperature sensor 24 detects a temperature of the coolant in the pipe 23b as a temperature (stack temperature T) of the fuel cell stack 10 (a plurality of single cells 11). The stack temperature T is applied to the ECU 50.

Further, the stack temperature T is obtained on the basis of a temperature of an anode off-gas discharged from the anode or a cathode off-gas discharged from the cathode.

[Cell Voltage Monitor]

As shown in JP2006-153780 and JP2006-153744, the cell voltage monitor 30 scans a plurality of single cells 11 at a predetermined frequency $\Delta t$ (for example, 300 ms) and detects a cell voltage V11 of each single cell which is applied to the ECU 50. The cell voltage monitor 30 has a main monitor 31 and a wiring harness 32.

The main monitor 31 includes a voltage detection circuit which detects the cell voltage V11, a scan circuit which scans a plurality of single cells 11 at a predetermined frequency $\Delta t$, a CPU, a ROM, and a RAM. A connector 32b of the wiring harness 32 is connected with the terminal 12 of each single cell. The main monitor 31 is connected with all the single cells 11 via the wiring harness. The main monitor 31 runs on a program embedded in a memory and scans a plurality of single cells 11 at a predetermined frequency (for example, 300 ms) and successively detects the cell voltage V11 of each single cell 11 which is applied to the ECU 50.

For example, one single cell 11 out of a plurality of single cells 11 is exemplified. The main monitor 31 intermittently detects a cell voltage V11 of the one single cell 11 at the predetermined frequency (predetermined timing) and outputs the cell voltage V11 to the ECU 50.

The predetermined frequency $\Delta t$ which is set on the basis of a test in advance depends on the number of single cells piled on one after another (the number of single cells comprising the fuel cell stack 10) or a throughput speed of a CPU in the main monitor 31.

The cell voltage monitor 30 has a minimum value of a cell voltage (minimum value cell voltage V0) in a detectable range in accordance with its specifications, for example, a resolution of a voltage detection circuit (for example, the detectable range is 0 to 1.2 V, the resolution is 0.3 V). If an actual cell voltage is over zero and is equal to or lower than the minimum value cell voltage V0 (0<detected voltage$\leqq$V0), a cell voltage V1 detected by the cell voltage monitor 30 is equal to the minimum value cell voltage V0 (V11=V0). If the actual cell voltage is zero, the cell voltage Vii is equal to zero (V11=0$\leqq$V0). Subsequently, the minimum value cell voltage V0 is stored in the ECU 50.

[Output Detector]

An output detector 41 is a device which detects an output current (stack current I) and an output voltage (stack voltage) of the fuel cell stack 10 (a plurality of single cells). The output detector 41 includes a current detection circuit and a voltage detection circuit and is connected with an output terminal of the fuel cell stack 10. The output detector 41 outputs the stack current I and the stack voltage to the ECU 50. The ECU 50 calculates a generated electric power of the fuel cell stack 10 on the basis of the stack current I and the stack voltage which the ECU 50 monitors.

A drive motor 42 is an electric motor which is a power source of the fuel cell vehicle. The drive motor is connected with an output terminal of the fuel cell stack 10 via the output detector 41.

[ECU]

The ECU 50 (failure determination device for a cell voltage monitor) is a control device which electronically controls the fuel cell system 1. The ECU 50 includes a CPU, a ROM, a RAM, hardware interfaces and electronic circuits.

The ECU 50 (a memory) is characterized in that the cell voltage monitor 30 detects cell voltages V11 of single cells 11 and has a function of storing the cell voltages of single cells 11. For example, all the single cells are numbered and all the cell voltages V11 are stored on the basis of a correlation between each single cell and an associated number.

Further, the ECU 50 (a minimum value determination unit) determines whether or not the present cell voltage detected by the cell voltage monitor 30 at the present time is equal to or lower than a minimum value cell voltage V0 which is associated with the cell voltage monitor 30.

In addition, the ECU 50 (a failure determination unit) determines that the cell voltage monitor 30 which detects the cell voltage V11 of the single cell 11 is completely or partially damaged when the cell voltage V11 detected at the present time is equal to or lower than the minimum value cell voltage V0, and a previous cell voltage detected and stored just before the failure determination is higher than a determination cell voltage V1.

[Operation of Fuel Cell System]

Next, an operation of the fuel cell system 1 and a failure determination process controlled by the ECU 50 (failure determination device for a cell voltage monitor) will be described with reference to FIG. 2.

To explain the above concisely, a following explanation is focused on one single cell 11 and a cell voltage V11.

In step S101, the ECU 50 determines whether or not the present cell voltage V11 detected by the cell voltage monitor 30 at the present time is equal to or lower than a minimum value V0.

If the present cell voltage V11 is equal to or lower than the minimum value cell voltage V0, the processing proceeds to step S102 (step S101, Yes). On the other hand, if the present cell voltage V11 is higher than the minimum value cell voltage V0, the processing proceeds to step S102 (step S101, No).

In step S102, the ECU 50 determines whether or not a previous cell voltage V11 detected and stored just before the failure determination is higher than a determination cell voltage V1.

If the previous cell voltage V11 is higher than the determination cell voltage V1, the processing proceeds to step S103 (step S102, Yes). On the other hand, if the previous cell voltage V11 is lower than the determination cell voltage V1, the processing proceeds to step S104 (step S102, No).

In step S103, the ECU 50 determines that the cell voltage monitor 30 is partially damaged. This is because the ECU 50 determines that the voltage detection circuit, the scan circuit, or the wiring harness 32 in the main monitor 31 detecting at a predetermined frequency Δt is partially disconnected and damaged due to the one single cell which is now focused.

Subsequently, the ECU 50 indicates that the cell voltage monitor 30 needs to be prepaired. For example, the ECU turns on a warning light for a driver. Finally, the processing ends, the failure determination process for the cell voltage monitor 30 is completed.

In step S104, the ECU 50 stores the present cell voltage V11 which the cell voltage monitor 30 detects. The processing proceeds to "Return" and then back to "Start".

[Effect of Fuel Cell System]

Figure 3:
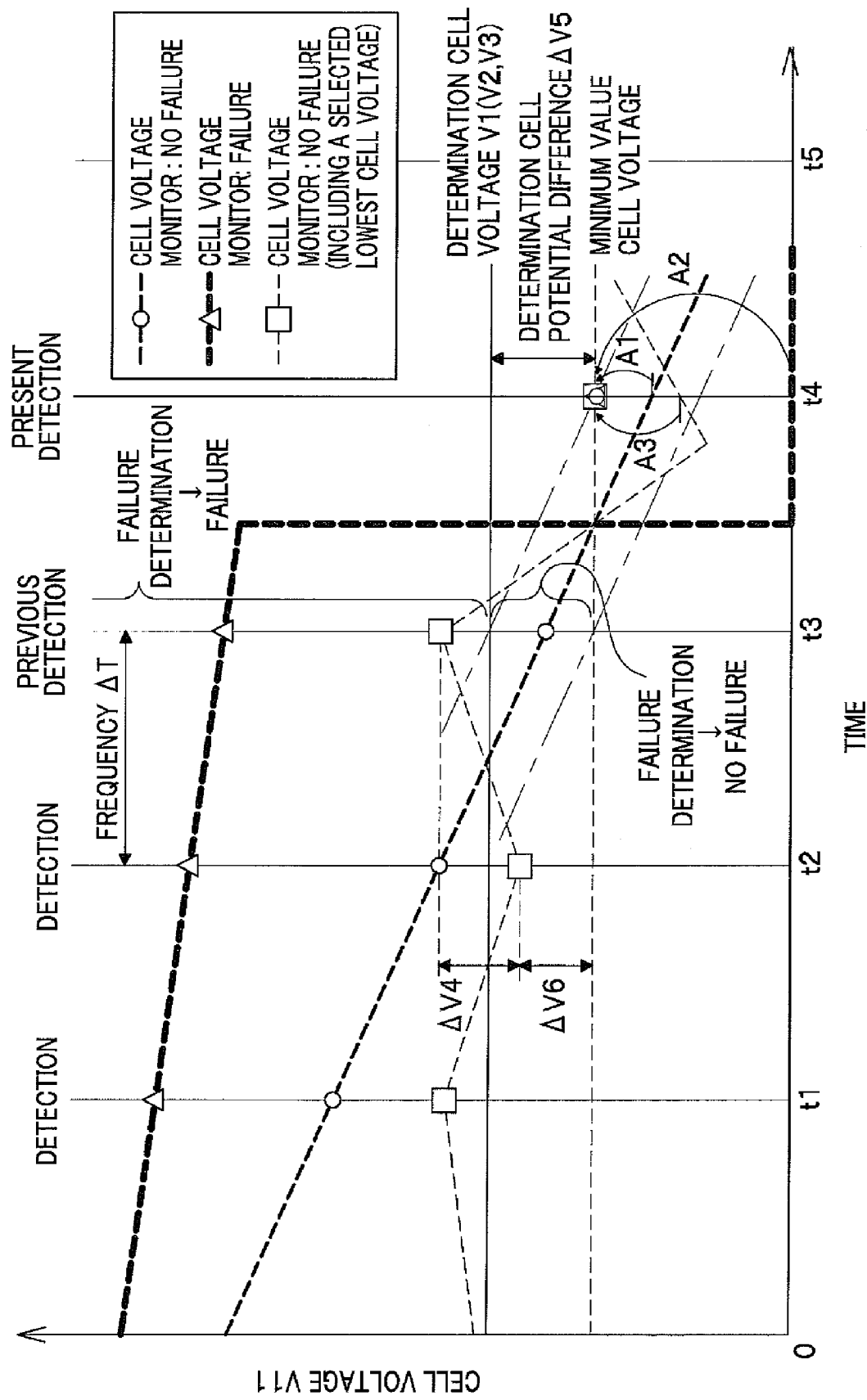
FIG. 3 is a time chart showing an operation of the fuel cell system in the first embodiment.

Effects of the fuel cell system 1 is as follows;

It is assumed that the cell voltage V11 of a single cell 11 normally drops as the output of the fuel cell system 1 drops, and as shown in FIG. 3, the present cell voltage V11 of the one single cell 11 becomes equal to the minimum value cell voltage V0 (refer to an arrow A1 in FIG. 3), and the previous cell voltage V11 becomes equal to or lower than the determination cell voltage V1. In this case, the ECU 50 determines that a section of the cell voltage monitor 30 which detects the cell voltage of the one single cell is not damaged since the cell voltage V11 drops within a proper range in the process of a normal voltage drop by the time the previous cell voltage V11 is detected until the present cell voltage V11 is detected.

On the other hand, if the wiring harness 32 is suddenly disconnected, as shown in FIG. 3, the present cell voltage V11 becomes equal to the minimum value cell voltage V0 (refer to an arrow A2 in FIG. 3), but the previous cell voltage V11 is higher than the determination cell voltage V1. In this case, the ECU 50 determines that the section of the cell voltage monitor 30 which detects the cell voltage V11 of the one single cell 11 has a failure since the cell voltage V11 drops beyond the proper range in the process of a normal voltage drop by the time the previous cell voltage V11 is detected until the present cell voltage V11 is detected.

In the fuel cell system 1, the ECU 50 functions as a failure determination device for the cell voltage monitor 30. The ECU 50 can store an operating program in advance, which saves additional parts in the fuel cell system 1 and helps to reduce production costs. Without the additional parts, the fuel cell system 1 can be so light and easy to handle that the fuel cell system 1 can easily be installed in a fuel cell vehicle or the like for which installation space is limited.

The present invention is not limited to particular embodiments as illustrated above without departing from the spirit and scope of the embodiments of the present invention as defined in the following claims. It is contemplated that numerous modification may be made to the exemplary embodiments of the invention.

The first embodiment exemplifies that the fuel cell system 1 is installed in the fuel cell vehicle. However, the fuel cell system 1 may be installed in a motorcycle, train or boat. Moreover, the present invention can be applied to a stationary fuel cell system at home, and a fuel cell system embedded in a hot water supplier.

In the first embodiment, the cell voltage monitor 30 detects the cell voltage V11 for each single cell 11. Further, the cell voltage monitor 30 may detect voltages for a pair of single cells as a set (the cell voltage doubles). Moreover, the cell voltage monitor 30 may detect voltages for a set of single cells, wherein the voltages are divided by the number of a set of single cells only to find a cell voltage on average.

In the first embodiment, the cell voltage monitor 30 and the ECU 50 (failure determination device for a cell voltage monitor) are separate. Further, the ECU 50 may include a partial function of the cell voltage monitor in another modification.

In the first embodiment, when the ECU 50 determines that the cell voltage monitor 30 has a failure, the ECU 50 turns on the warning light and finishes the failure determination process. Further, in another modification, when the ECU 50 determines that the cell voltage monitor 30 is partially damaged due to one single cell 11 which is now focused, on the basis of an associated number for the one single cell, the ECU 50 uses a flag to indicate that a section of the cell voltage monitor which detects a cell voltage V11 of the one single cell 11 is damaged. The ECU 50 stops detecting the cell voltage V11 of this damaged single cell.

Subsequently, the ECU 50 continues to detect the cell voltages V11 of the other single cells 11 which normally operate. In FIG. 2, the processing proceeds to step S101 from step S103 via step "Return" and "Start".

The ECU 50 continues a failure determination process up to some point, for example, until a fourth of all the single cells is damaged. When a fourth of all the single cells is damaged, the ECU 50 determines that the cell voltage monitor 30 is finally damaged as a whole. The ECU 50 activates a warning light for a driver.

In another modification, the processing proceeds to step S104 from step S103. The ECU 50 determines that the cell voltage monitor 30 is damaged when the ECU 50 detects at predetermined times in a row (for example, five times) that a single cell is damaged.

Second Embodiment

A second embodiment of the present invention will be described with reference to FIG. 4 and FIG. 5. Different elements which is not found in the first embodiment will be explained.

Hardware elements of the fuel cell system in the second embodiment is same as those of the first embodiment. However, a program installed in the ECU 50 (failure determination device for a cell voltage monitor) in the second embodiment is different from that of the first embodiment in an operation.

Figure 4:
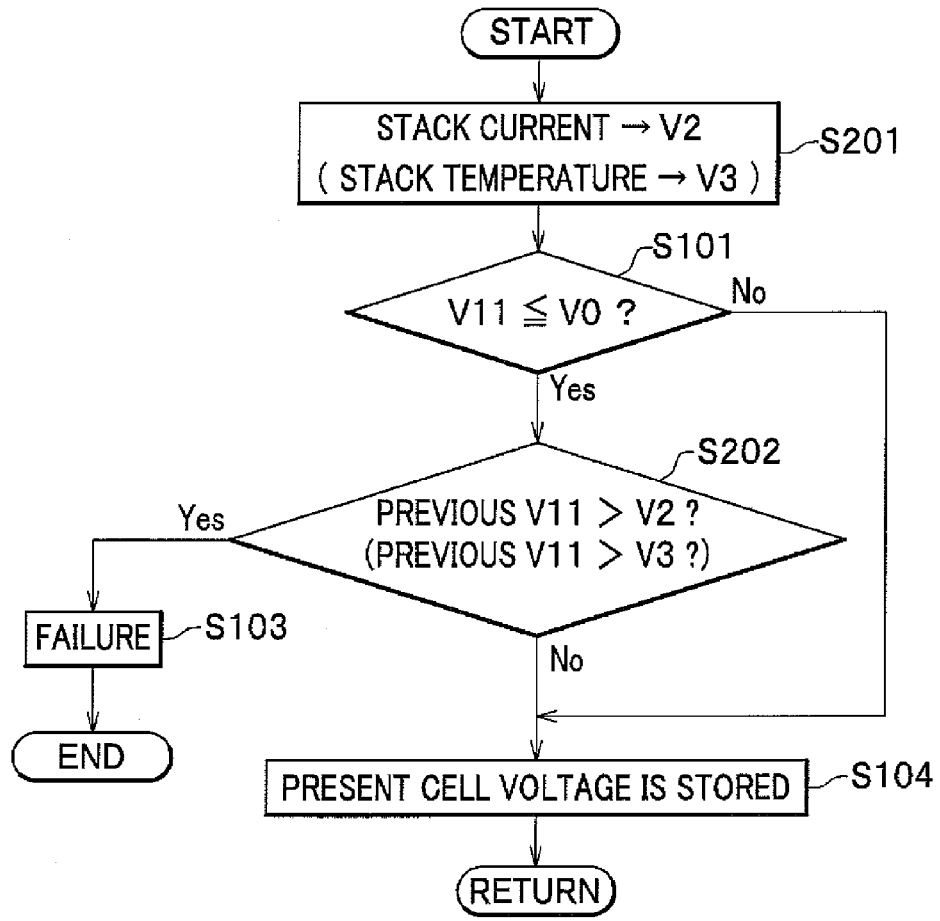
FIG. 4 is a flowchart showing an operation of the fuel cell system of a second embodiment.
Figure 5:
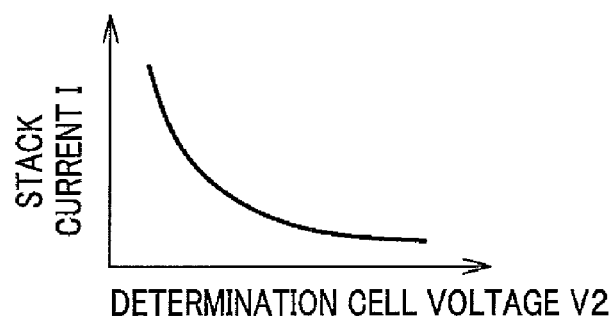
FIG. 5 is a graph showing the relation between an output current of a fuel cell stack and a determination cell voltage.

To be specific, in step S201 as shown in FIG. 4, the ECU 50 (failure determination device for a cell voltage monitor) calculates (sets) a determination cell voltage V2 on the basis of a current-voltage characteristics stored in the ECU 50 as shown in FIG. 5 and a current of the fuel cell stack 10 (stack current I) which the output detector 41 outputs.

A current-voltage characteristics in FIG. 5 shows a relation between the stack current I and the determination cell voltage V2. As the stack current I increases, so the determination cell voltage V2 decreases. Because an increase in the stack current I naturally causes an increase in the current flowing through each single cell which is connected in series with other single cells, accordingly, the cell voltage V11 drops in accordance with the current-voltage characteristics which the single cell 11 has.

In step S101, the processing proceeds to step S202 if the present cell voltage V11 is equal to or lower than a minimum value cell voltage V0 (step S101, Yes). In step S202, the ECU 50 determines whether or not the previous cell voltage V11 is higher than a determination cell voltage V2 which is calculated in step S201. The processing proceeds to step S103 when the ECU 50 determines that the present cell voltage V11 is higher than the determination cell voltage V2 (step S202, Yes). On the other hand, the processing proceeds to step S104 when the ECU 50 determines that the previous cell voltage V11 is lower than the determination cell voltage V2 (step S202, No).

A fuel cell system in the second embodiment can properly set the determination cell voltage V2 on the basis of the present stack current I (power generation) and determine whether or not the cell voltage monitor 30 is damaged on the basis of the previous cell voltage V11 and the determination cell voltage V2 (refer to FIG. 3).

In the second embodiment, the ECU 50 sets the determination cell voltage V2 on the basis of the stack current I. However, in another modification, the ECU 50 sets the determination cell voltage V2 on the basis of an electric power (stack electric power) or a voltage (stack voltage) of the fuel cell stack 10 which the output detector 41 detects. When the ECU 50 sets the determination cell voltage V2 on the basis of the stack voltage, an increase in the stack voltage leads to an increases in the determination cell voltage V2. When the ECU 50 sets the determination cell voltage V2 on the basis of the stack electric power, an increases in the stack electric power leads to a decrease in the determination cell voltage.

Figure 6:
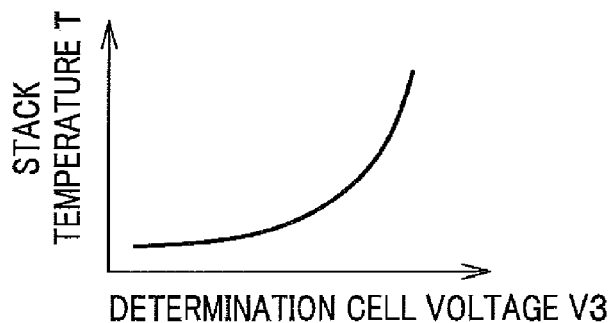
FIG. 6 is a graph showing the relation between a temperature of the fuel cell stack and the determination cell voltage.

In another modification, the ECU 50 sets a determination cell voltage V3 on the basis of a temperature of the fuel cell stack 10 (stack temperature) which the temperature sensor 24 detects (step S201 in FIG. 4), and the ECU 50 determines whether or not the cell voltage monitor 30 is damaged on the basis of the previous cell voltage V11 and the stack temperature (step S202 in FIG. 4). In this case, the determination cell voltage V3 increases as the stack temperature T increases as shown in FIG. 6. This is because current-voltage characteristics of the fuel cell stack and the single cell increase.

Third Embodiment

A third embodiment of the present invention will be described with reference to FIG. 7.

Figure 2:
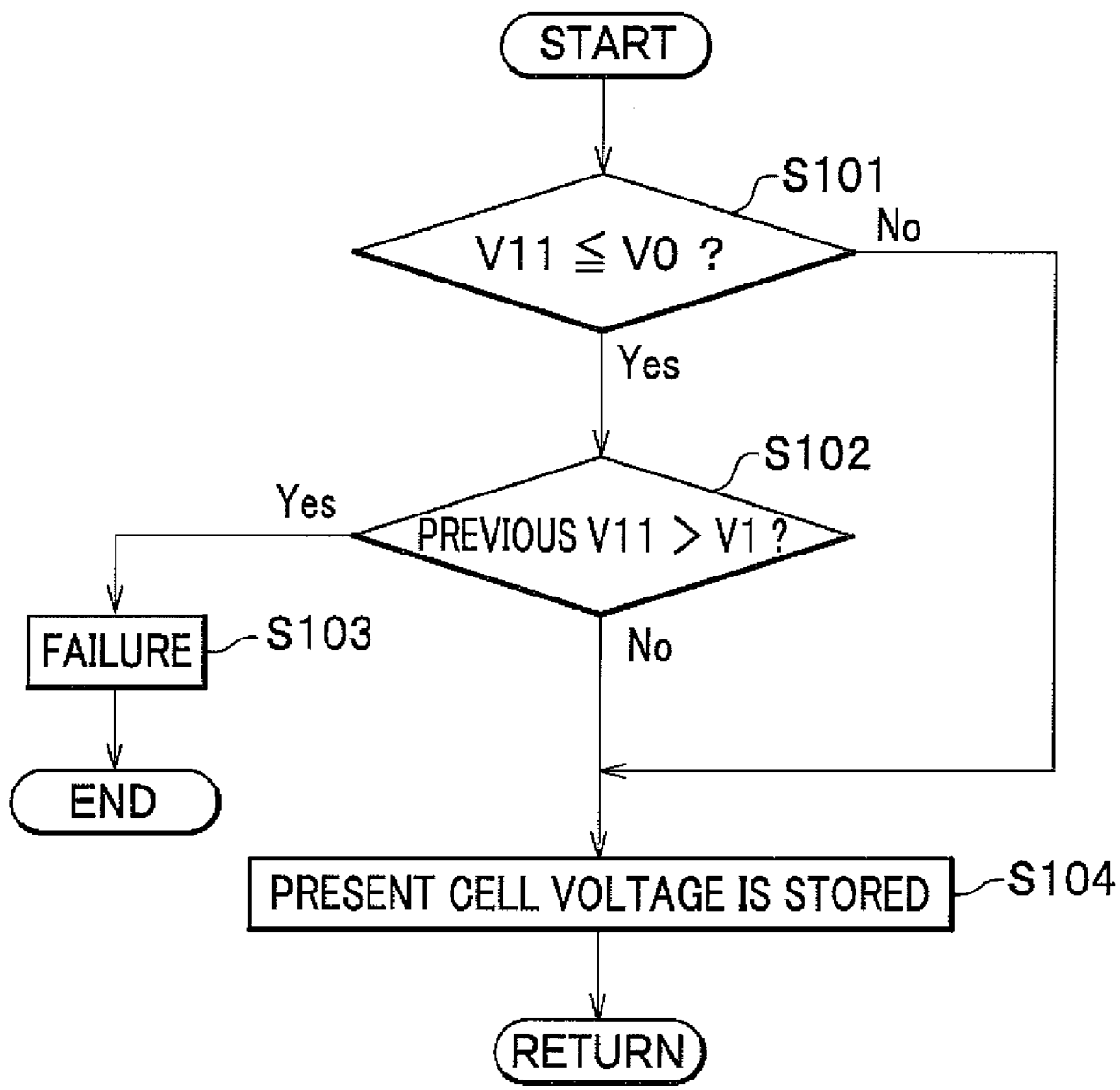
FIG. 2 is a flowchart showing an operation of the fuel cell system of the first embodiment.
Figure 7:
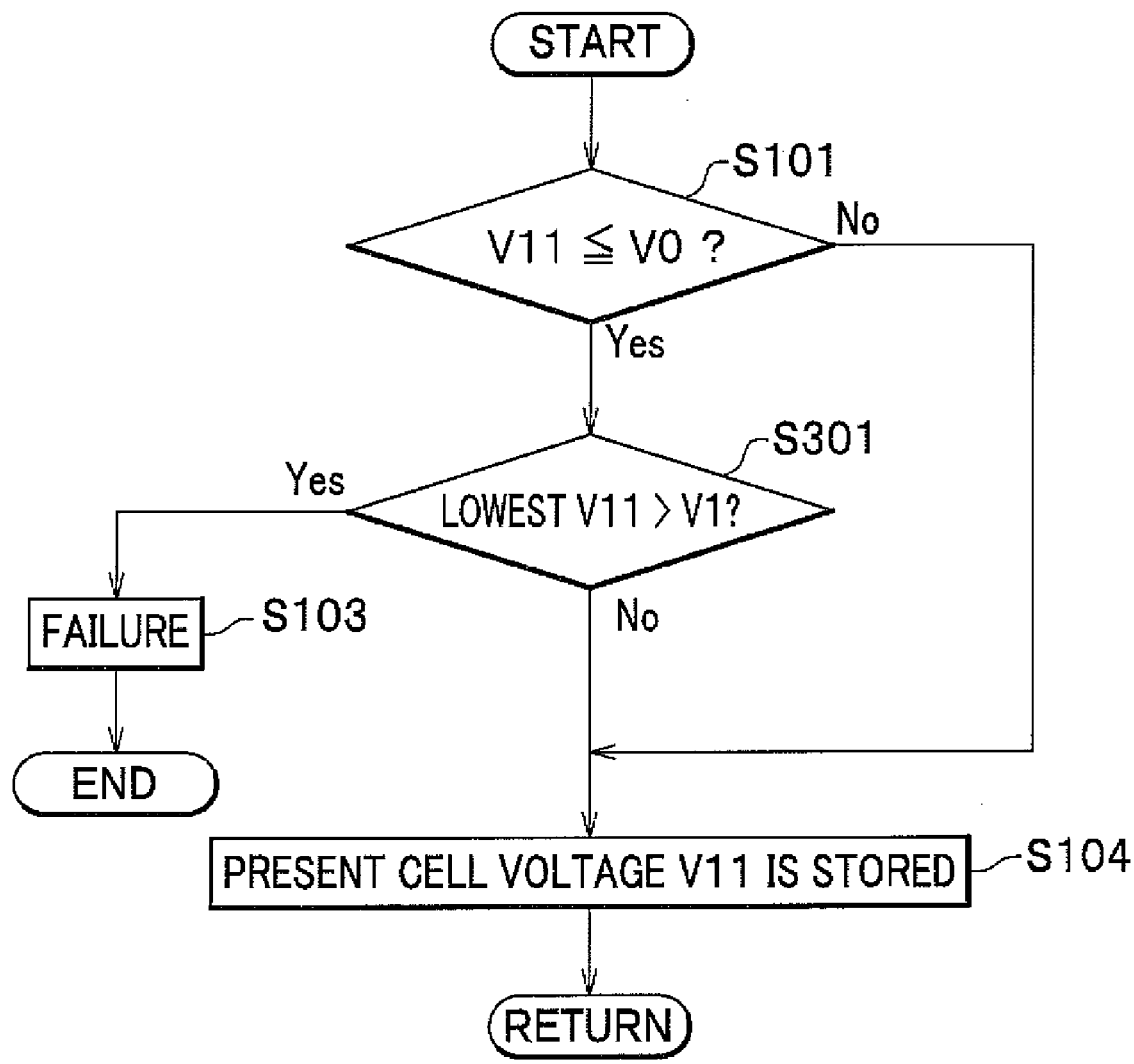
FIG. 7 is a flowchart showing an operation of the fuel cell system of a third embodiment.

The processing regarding the fuel cell system in the third embodiment includes step S301 as shown in FIG. 7 instead of step S102 in the first embodiment (refer to FIG. 2).

In step S301, the ECU 50 selects the lowest cell voltage V11 out of a plurality of cell voltages V11 which the cell voltage monitor 30 has detected in the past and stored at predetermined times (for example, 10 times) just before the failure determination is carried out. Subsequently, the ECU determines whether or not the selected lowest cell voltage V11 is higher than the determination cell voltage V1.

If the selected lowest cell voltage V11 is higher than the determination cell voltage V1 (step S301, Yes), the processing proceeds to step S103. On the other hand, if the selected lowest cell voltage V11 is lower than the determination cell voltage V1 (step S301, No), the processing proceeds to step S104.

The fuel cell system can determine whether or not the cell voltage monitor 30 has a failure, even if the cell voltage V11 just before the failure determination in step S301 is unstable (FIG. 3). To be specific, when the present cell voltage V11 is equal to the minimum value cell voltage V0 at the present time (refer to an arrow A3 in FIG. 3), and when the previous cell voltage V11 is higher than the determination cell voltage V1, the ECU 50 can determine whether or not the cell voltage monitor 30 has a failure on the basis of the selected lowest cell voltage V11 and the determination cell voltage V1.

In another modification, when the minimum value cell voltage is detected, and the previous cell voltage just before the detection is unstable, the ECU 50 (failure determination device for a cell voltage monitor) stops the failure determination for the cell voltage monitor 30. To be specific, when an amplitude of the cell voltage is greater than a predetermined potential difference $\Delta V4$, the ECU 50 stops the failure determination for the cell voltage monitor 30 (FIG. 3). A period in which the cell voltage fluctuates due to instability can be set on the basis of a test in advance and thereafter stored in the ECU 50. The same applies to the predetermined potential difference $\Delta V4$.

Fourth Embodiment

Next, a fourth embodiment of the present invention will be described with reference to FIG. 8.

A fuel cell system in the fourth embodiment includes step S401 as shown in FIG. 8 instead of step S102 in the first embodiment (as shown in FIG. 2).

In step S401, the ECU 50 determines whether or not the potential difference between the previous cell voltage V11 and the minimum value cell voltage V0 is greater than a determination cell potential difference $\Delta V5$ (FIG. 3). The processing proceeds to step S103 when the ECU determines that the potential difference between the previous cell voltage V11 and the minimum value cell voltage V0 is greater than the determination cell potential difference $\Delta V5$ (step S401, Yes). On the other hand, the processing proceeds to step S104 when the ECU determines that the potential difference between the previous cell voltage V11 and the minimum value cell voltage V0 is lower than the determination cell potential difference $\Delta V5$ (step S401, No).

The determination cell potential difference $\Delta V5$ is a potential difference between the determination cell voltage V1 and a the minimum value cell voltage V0 in the first embodiment ($\Delta V5 = V1 - V0$) and is stored in the ECU 50 in advance.

The determination cell potential difference $\Delta V5$ is not limited to the application mentioned above. The ECU 50 (determination cell potential difference setting unit) may set the determination cell potential difference $\Delta V5$ when the failure determination is carried out on the basis of the stack current I and the stack temperature T. In this case, the determination cell potential difference $\Delta V5$ decreases, as the stack current I increases. The determination cell potential difference $\Delta V5$ increases, as the stack temperature T increases.

The fuel cell system in the fourth embodiment can determine whether or not the cell voltage monitor 30 has a failure when the present cell voltage V11 becomes equal to or lower than the minimum value cell voltage V0 (step S101, Yes), and the potential difference between the present cell voltage V11 and the minimum value cell voltage V0 is greater than the determination cell potential difference ΔV5 (step S401, Yes).

In the fourth embodiment, the ECU 50 determines whether or not the potential difference between the previous cell voltage V11 and the minimum value cell voltage V0 is greater than a determination cell potential difference ΔV5. In another modification, if the cell voltage V11 before the failure determination is unstable, the ECU 50 compares the determination cell potential difference ΔV5 with a potential difference ΔV6, the potential difference ΔV6 is a potential difference between the minimum value cell voltage V0 and the selected lowest cell voltage V11 out of a plurality of cell voltages detected at a predetermined timing (interval). The ECU 50 determines whether or not the cell voltage monitor 30 has a failure.

What is claimed is:

1. A failure determination device for a cell voltage monitor which detects cell voltages of a plurality of single cells connected in series at a predetermined interval, the device comprising:
a memory for storing the cell voltages detected by the cell voltage monitor;
a minimum value determination unit for determining whether or not a present cell voltage detected by the cell voltage monitor is equal to or lower than a minimum value cell voltage which is in a detectable range of the cell voltage monitor; and
a failure determination unit for determining that the cell voltage monitor has a failure when the minimum value determination unit determines that the present cell voltage is equal to or lower than the minimum value cell voltage, and a cell voltage detected by the cell voltage monitor in a past and stored in the memory is higher than a determination cell voltage; and
a determination cell voltage setting unit which sets the determination cell voltage on a basis of a total output or a temperature of the plurality of single cells as a whole, and further on a basis of a timing at which the cell voltage monitor detects the cell voltage and a decreasing ratio of the cell voltage of one of the single cells or a pair of the single cells in the process of a normal voltage drop,
wherein the determination cell voltage is higher than the minimum value cell voltage by a predetermined value, and
wherein the determination cell voltage setting unit sets the determination cell voltage to be lower if the total output is greater, or sets the determination cell voltage to be higher if the temperature of the plurality of single cells as a whole is higher.

2. The failure determination device for a cell voltage monitor according to claim 1, wherein the failure determination unit carries out a failure determination on a basis of a cell voltage detected just before the failure determination, out of a plurality of cell voltages stored in the memory in a past.

3. The failure determination device for a cell voltage monitor according to claim 1, wherein the failure determination unit does not determine whether or not the cell voltage monitor has a failure when a cell voltage detected just before a failure determination is unstable.

4. The failure determination device for a cell voltage monitor according to claim 1, wherein a plurality of single cells comprises a fuel cell.

5. The failure determination device for a cell voltage monitor according to claim 1, wherein a cell voltage is set based on a voltage value of a pair of single cells.

6. The failure determination device for a cell voltage monitor according to claim 1, wherein a cell voltage is set based on an averaged voltage value of a set of detected cell voltages.

7. The failure determination device for a cell voltage monitor according to claim 1, wherein the device associates all single cells with a number and uses a flag when a single cell has a failure, wherein the device stores an associated number of the damaged single cell and continues a failure determination process without detecting a cell voltage of the damaged single cell until a predetermined number of damaged single cells is counted, and wherein the device determines that the cell voltage monitor has a failure.

8. The failure determination device for a cell voltage monitor according to claim 1, wherein the device determines that a cell voltage monitor has a failure when single cells have a failure at predetermined times in a row.

9. The failure determination device for a cell voltage monitor according to claim 1, wherein the device selects a lowest cell voltage out of a plurality of cell voltages detected by a cell voltage monitor in a past and stored by a memory at predetermined times just before a failure determination, and wherein the device determines whether or not the lowest cell voltage is higher than a determination cell voltage.

10. A failure determination device for a cell voltage monitor which detects cell voltages of a plurality of single cells connected in series at a predetermined interval, the device comprising:
a memory for storing a cell voltage detected by the cell voltage monitor;
a minimum value determination unit for determining whether or not a present cell voltage detected by the cell voltage monitor is equal to or lower than a minimum value cell voltage which is in a detectable range of the cell voltage monitor; and
a failure determination unit for determining that the cell voltage monitor has a failure when the minimum value determination unit determines that the present cell voltage is equal to or lower than the minimum value cell voltage, and a potential difference between the minimum value cell voltage and a cell voltage detected by the cell voltage monitor in a past and stored in the memory is higher than a determination cell potential difference.

11. The failure determination device for a cell voltage monitor according to claim 10, further comprising a determination cell potential difference setting unit which sets the determination cell potential difference on a basis of a total output.

12. The failure determination device for a cell voltage monitor according to claim 10, further comprising a determination cell potential difference setting unit which sets the determination cell potential difference on a basis of a temperature of a plurality of single cells as a whole.

13. The failure determination device for a cell voltage monitor according to claim 10, wherein the failure determination unit carries out a failure determination on a basis of a cell voltage detected just before the failure determination, out of a plurality of cell voltages stored in the memory in a past.

14. The failure determination device for a cell voltage monitor according to claim 10, wherein the failure determination unit does not determine whether or not the cell voltage monitor has a failure when a cell voltage detected just before a failure determination is unstable.

15. The failure determination device for a cell voltage monitor according to claim 10, wherein a plurality of single cells comprises a fuel cell.

16. The failure determination device for a cell voltage monitor according to claim 10, wherein the device compares a determination cell potential difference with a potential difference lied between a minimum value cell voltage and a lowest cell voltage out of a plurality of cell voltages detected at predetermined times just before a failure determination when a cell voltage detected just before the failure determination is unstable, and wherein the device determines whether or not a cell voltage monitor has a failure.

17. A method for determining a failure of a cell voltage monitor which detects cell voltages of a plurality of single cells connected in series at a predetermined interval, the method comprising the steps of:
  storing the cell voltages detected by the cell voltage monitor;
  determining whether or not a present cell voltage detected by the cell voltage monitor is equal to or lower than a minimum value cell voltage which is in a detectable range of the cell voltage monitor; and
  determining that the cell voltage monitor has a failure when the minimum value determination unit determines that the present cell voltage is equal to or lower than the minimum value cell voltage, and a cell voltage detected by the cell voltage monitor in a past and stored in the memory is higher than a determination cell voltage,
  setting the determination cell voltage on a basis of a total output or a temperature of the plurality of single cells as a whole, and further on a basis of a timing at which the cell voltage monitor detects the cell voltage and a decreasing ratio of the cell voltage of one of the single cells or a pair of the single cells in the process of a normal voltage drop,
  wherein the determination cell voltage is higher than the minimum value cell voltage by a predetermined value, and
  wherein the determination cell voltage is set to be lower if the total output is greater, or is set to be higher if the temperature of the plurality of single cells as a whole is higher.

18. A method of determining a failure of a cell voltage monitor which detects cell voltages of a plurality of single cells connected in series at a predetermined interval, the method comprising the steps of:
  storing a cell voltage detected by the cell voltage monitor;
  determining whether or not a present cell voltage detected by the cell voltage monitor is equal to or lower than a minimum value cell voltage which is in a detectable range of the cell voltage monitor; and
  determining that the cell voltage monitor has a failure when the minimum value determination unit determines that the present cell voltage is equal to or lower than the minimum value cell voltage, and a potential difference between the minimum value cell voltage and a cell voltage detected by the cell voltage monitor in a past and stored in the memory is higher than a determination cell potential difference.

19. The failure determination device for a cell voltage monitor according to claim 10, wherein the device associates all single cells with a number and uses a flag when a single cell has a failure, wherein the device stores an associated number of the damaged single cell and continues a failure determination process without detecting a cell voltage of the damaged single cell until a predetermined number of damaged single cells is counted, and wherein the device determines that the cell voltage monitor has a failure.

20. The failure determination device for a cell voltage monitor according to claim 10, wherein the device determines that a cell voltage monitor has a failure when single cells have a failure at predetermined times in a row.

* * * * *